(12) United States Patent
Golladay et al.

(10) Patent No.: US 6,596,999 B2
(45) Date of Patent: Jul. 22, 2003

(54) HIGH PERFORMANCE SOURCE FOR ELECTRON BEAM PROJECTION LITHOGRAPHY

(75) Inventors: Steven D. Golladay, Hopewell Junction, NY (US); Michael S. Gordon, Lincolndale, NY (US); Rodney A. Kendall, Ridgefield, CT (US); Shinichi Kojima, Wappingers Falls, NY (US); Werner Stickel, Ridgefield, CT (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/986,176

(22) Filed: Nov. 7, 2001

(65) Prior Publication Data

US 2003/0085364 A1 May 8, 2003

(51) Int. Cl.[7] .................................................. H01J 37/30
(52) U.S. Cl. ................................ 250/423 F; 250/492.2; 250/396; 250/492.23; 250/396 ML; 250/398
(58) Field of Search .......................... 250/423 F, 492.2, 250/396, 492, 492.23, 396 ML, 398

(56) References Cited

U.S. PATENT DOCUMENTS 4,929,838 A * 5/1990 Yasuda et al. ............ 250/492.2
5,041,732 A * 8/1991 Saito et al. ............... 250/396 ML
6,087,667 A * 7/2000 Nakasuji et al. ........... 250/492.2

OTHER PUBLICATIONS

Pub. No.: US 2002/0121615 A1 "Method and Devices for Detecting and cancelling Magnetic Fields . . . " by M. Nakasuji, Sep. 5, 2002.*

* cited by examiner

Primary Examiner—John R. Lee
Assistant Examiner—Zia R. Hashmi
(74) Attorney, Agent, or Firm—Whitham, Curtis & Christofferson, P.C.

(57) ABSTRACT

The presence of magnetic fields from lenses and other (e.g. parasitic) sources at locations in a charged particle beam system such as the charged particle emitter, where the particles have little or no kinetic energy, creates disturbances of the charged particle trajectories, generating undesired angular momentum and resulting in excessive aberrations and associated adverse effects on system performance. Solutions are provided by suppression of these magnetic fields, by relocating the charged particle emitter away from the field source and/or counterbalancing the field with a bucking field. In addition, residual irrepressible field asymmetries are compensated by a suitable element such as a stigmator located at the correct location in the beam path, permitted by relocation of the charged particle emitter.

20 Claims, 10 Drawing Sheets

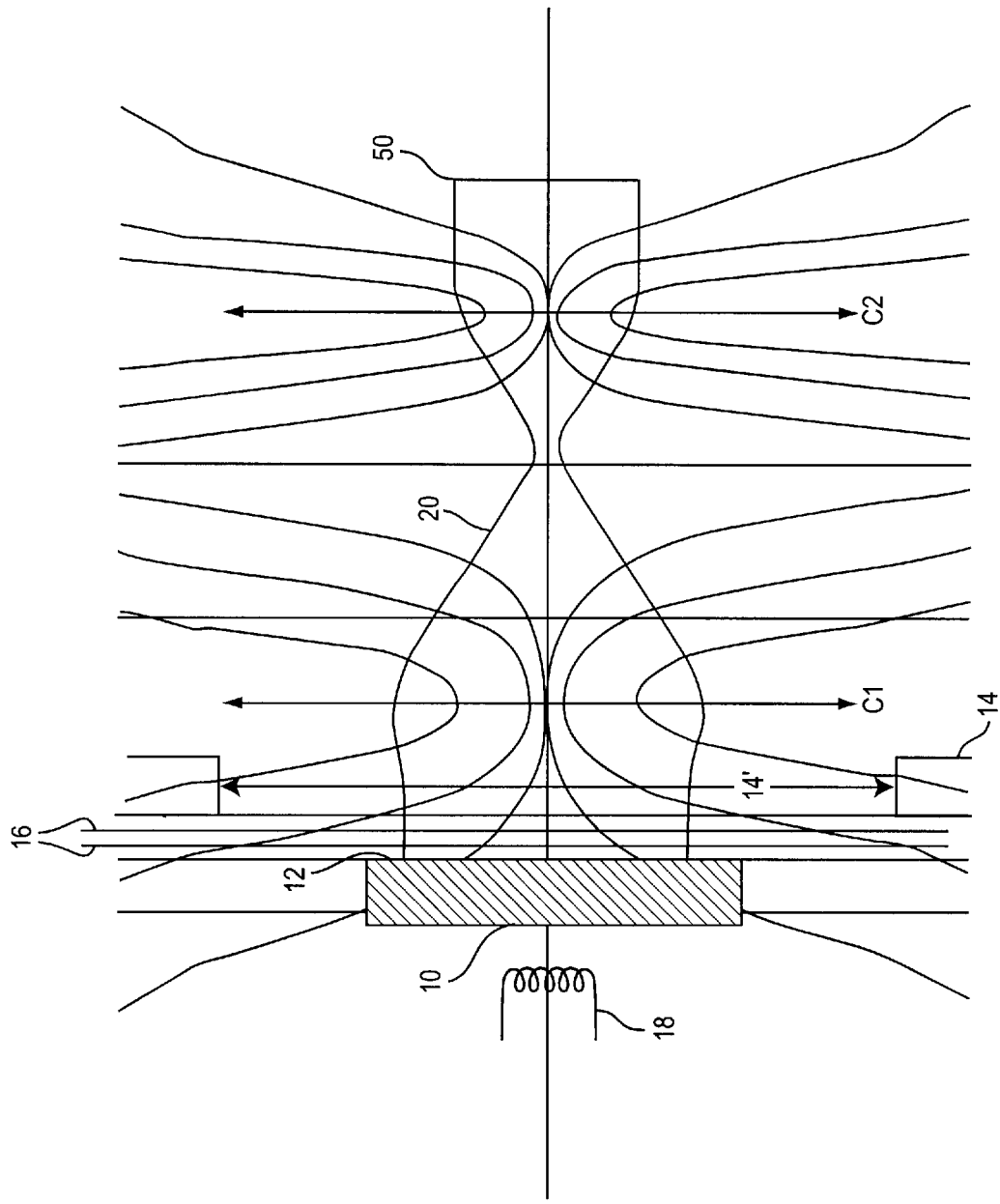

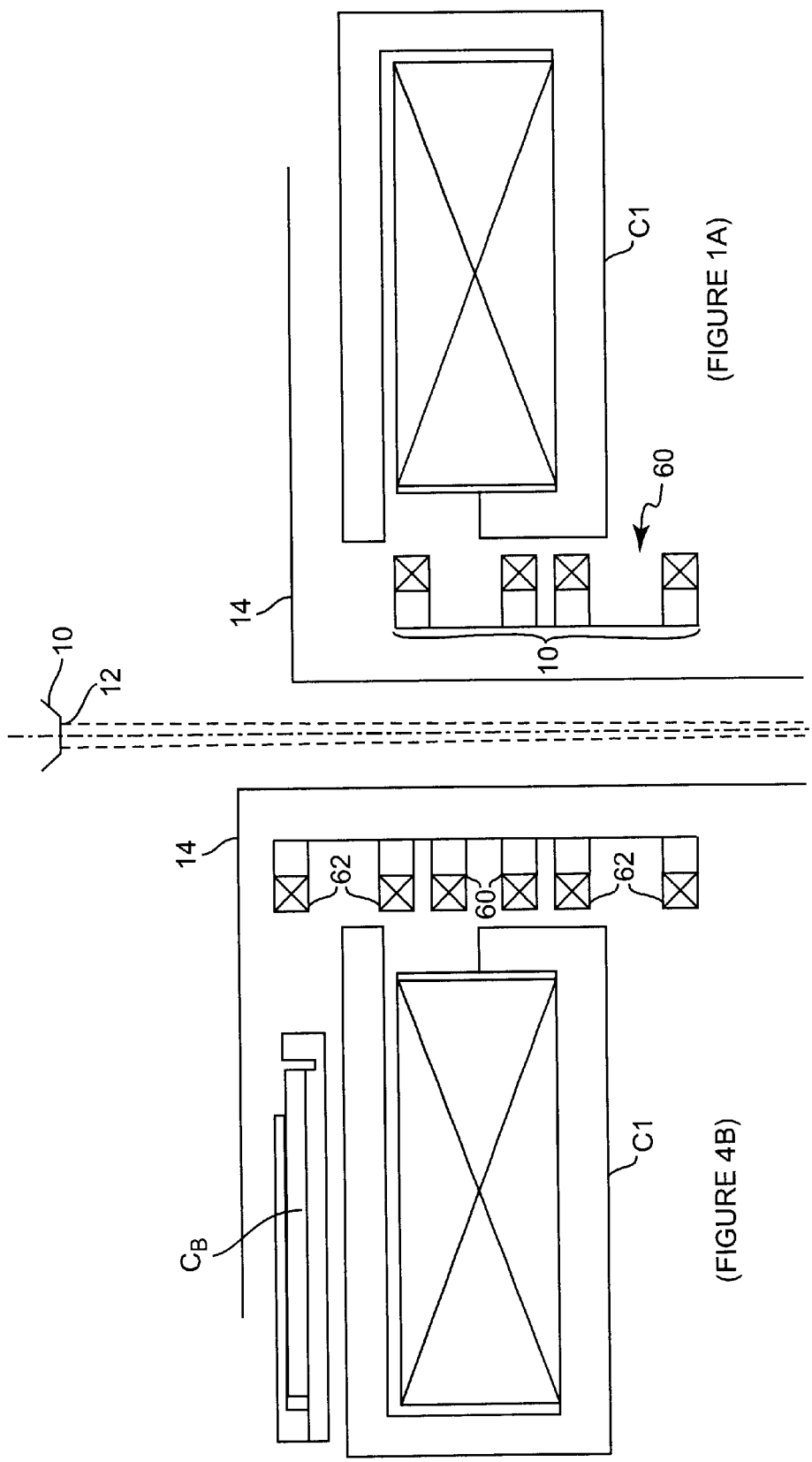

HIGH PERFORMANCE SOURCE FOR ELECTRON BEAM PROJECTION LITHOGRAPHY

BACKGROUND OF THE INVENTION

1. Field of the Invention

The present invention generally relates to charged particle beam tools and, more particularly, to electron beam projection lithography tools having electron (charged particle) emitter or cathode of large dimensions.

2. Description of the Prior Art

Charged particle beam tools are known for numerous applications such as electron beam microscopy. Numerous applications have also been developed in the semiconductor device manufacturing industry such as for impurity implantation and lithographic exposures of patterns having feature sizes with dimensions smaller than can be resolved using electromagnetic radiation and the manufacture of x-ray lithography masks which must be formed at the same minimum feature size as the exposure to be made. In this regard, reduced feature sizes and increased integration density in integrated circuits provides increased performance and functionality as well as providing increases in manufacturing economy.

However, the graphic pattern complexity increases with integration density. The well-known probe-forming type of electron beam lithographic exposure tool is generally arranged to expose a small shaped spot repeatedly at high speed to form the desired pattern. The shaped spot may include only a relatively few (e.g. one hundred or fewer) pixels while the complete chip pattern may include millions of pixels for current designs and numbers of pixels orders of magnitude larger are foreseeable. Therefore, while probe-forming electron beam exposure tools are often used at the present time for custom chips and application specific integrated circuits (ASICS) which are usually manufactured in limited quantities, probe-forming tools have insufficient throughput to support production quantities of integrated circuits at the present state of the art.

Accordingly, electron beam projection tools have recently been developed. These tools project a sub-field of a desired pattern formed in a reticle onto the target such as a resist-coated wafer. The sub-fields, while small compared to the entire chip pattern, are large in comparison to the circuit feature sizes and may include tens of millions of pixels which may be simultaneously exposed at rates only slightly reduced, if at all, from the exposure rate of probe-forming beam tool exposures. Unfortunately, an electron beam projection tool must deliver images at the target or wafer plane of extremely good fidelity to the reticle pattern and are thus of substantial complexity in design and difficult to adjust in order to obtain optimum or even adequate performance. Further, the illumination must be highly uniform over an entire sub-field. Therefore, a cathode (emitter) of substantial size and high emission uniformity is required.

Further, the beam current in electron beam projection tools is relatively high and the electron beam column must be kept short to minimize effects of Coulomb interactions between particles of like charge as well as other, possibly more intractable physical constraints such as the maximum height of the tool/beam column relative to a standard clean room or requirements for other changes in beam column optics to obtain desired magnification and the like. Aberrations and deflection errors must be held to a small fraction of the minimum feature size to allow the sub-fields to be properly stitched together. In addition, to minimize variations of the critical feature dimensions across the subfield, the variation of current density distribution across the subfield must be held to 1% or less.

The elements of an electron optical system (e.g. lenses, deflectors and the like) are effectively defined by magnetic or electric fields which, in principle, have infinite extension at least along the axis of the system and, therefore, to a greater or lesser extent, interact or interfere with each other. Minimization of detrimental interference by separation of elements is usually very limited and may not even be feasible in adequate degree due to optical design constraints or environmental constraints on the size of the system. Complete suppression of such interference then requires increased complexity of the system and calibration/operation thereof due to added elements.

Further, an undesired interference may exist between an emitter of charged particles and an optical element in the vicinity of the emitter. For example, the field of a magnetic lens may affect electrons at their point of origin.

In summary, the number of magnetic and/or electrostatic elements and limited column length may cause interactions and interferences which are undesirable and which may not be feasible to adequately minimize.

SUMMARY OF THE INVENTION

It is therefore an object of the present invention to provide an arrangement and technique of reducing perturbation of low energy charged particles in the vicinity of their source in a charged particle beam tool.

It is another object of the invention to provide control of symmetrical and/or asymmetrical angular momentum and other perturbations due to interactions of the cathode, anode opening (or vice-versa for ion beam tools) and first condenser with low-energy charged particles in a charged particle beam tool.

It is a further object of the invention to provide a charged particle emitter having improved beam uniformity at a shaping aperture, reticle, wafer or object and reduced enlargement, astigmatism and distortion at the crossover in order to support enhanced performance of a charged particle beam tool such as an electron beam projection lithography tool to produce lithographic features.

In order to accomplish these and other objects of the invention, a charged particle beam illumination system is provided including a first condenser lens, an accelerating electrode, a charged particle emitter axially separated from the accelerating electrode, and an arrangement for reducing the magnetic field of said first condenser lens at said charged particle emitter.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a view of a simulation of trajectory of portions of a beam in a portion of an electron beam projection lithography tool not including the invention, FIG. 5 shows a cross-section through a portion of the system including the electron gun and first condenser; a third and preferred embodiment of the invention corresponding to the configuration illustrated in FIG. 4B being shown on the left side and, for comparison purposes, a configuration subject to undesirable interference effects being shown on the right side, and FIG. 6 schematically illustrates first order optics of the electron beam source in accordance with the invention.

DETAILED DESCRIPTION OF A PREFERRED EMBODIMENT OF THE INVENTION

Figure 1B:
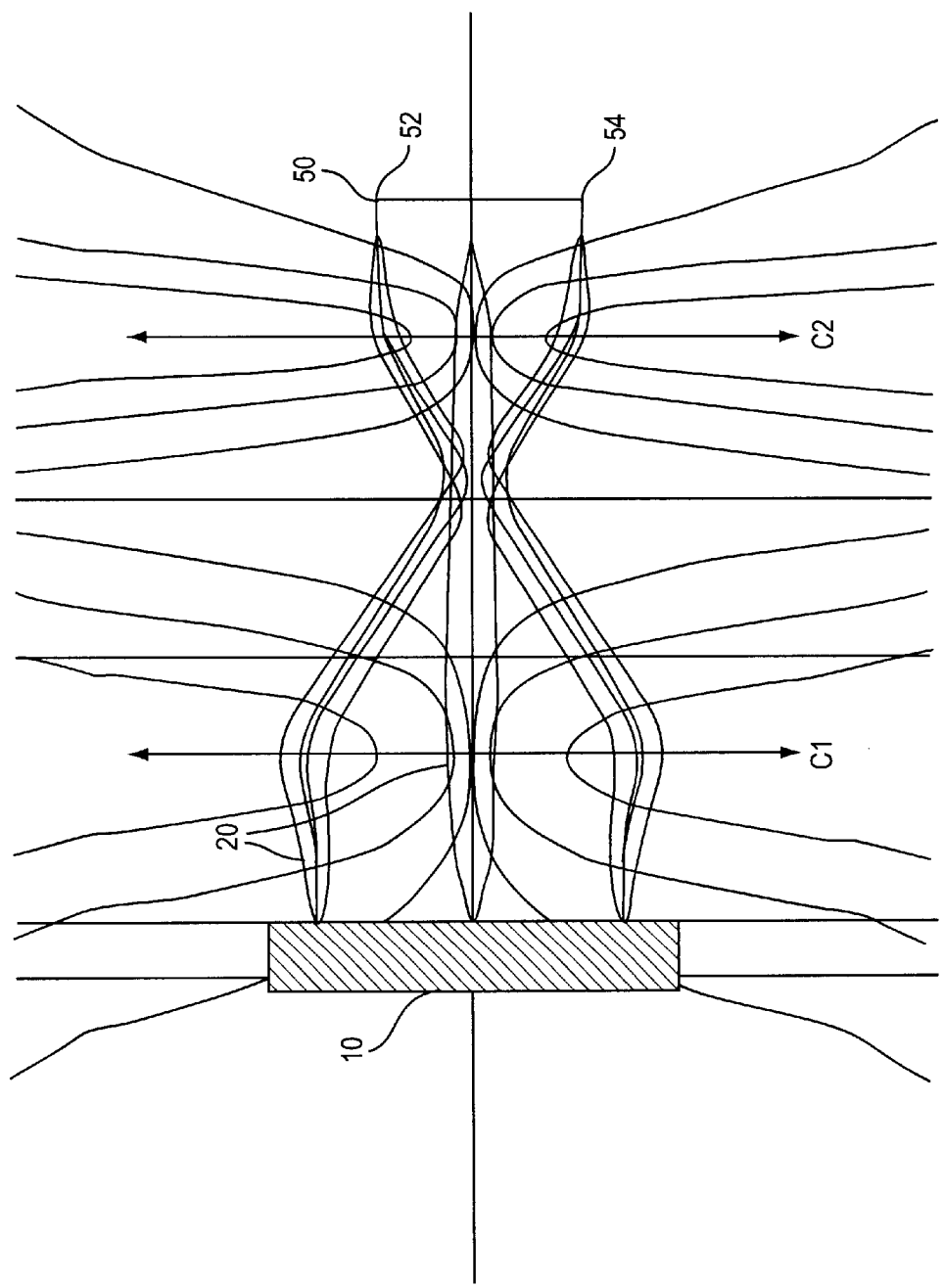
FIG. 1B illustrates, with additional trajectories shown, the problem of aberrated crossover due to interference which is solved by the invention.

Referring now to the drawings, and more particularly to FIG. 1A, there is shown a cross-section of a portion of the electron column of an electron beam projection tool which does not include the invention. FIG. 1A also includes a simulation of an electron trajectory from exemplary points on a broad electron emitter. Since this illustration is arranged to facilitate an understanding of the invention and the inventors are unaware of any prior publication indicating recognition of the problem addressed by the invention and illustrated in FIG. 1A, the Figure is designated as "Related Art" and no admission is made that any portion of FIG. 1A constitutes prior art in regard to any aspect of the present invention.

In this regard, it was noted above that some interactions between elements of a charged particle beam system are recognized or theoretically predictable but negligible for particular feature size regimes while others may be unknown or unrecognized by those skilled in the art. The inventors have discovered some interactions which are severely deleterious to the lithographic image fidelity at feature size regimes which the inventors are currently exploring.

Specifically, there is unavoidable interference between the magnetic field of the condenser lens C1 nearest the electron (charged particle) emitter or cathode 10 with the electrons in the region between the electron (charged particle) emitter or cathode and that condenser lens. The magnetic field of condenser lens C1 penetrates the surface of the cathode 10, well below its surface 12. In this region, the electrons remain under acceleration after emerging from the electron (charged particle) emitter or cathode with near zero energy and are therefore easily perturbed.

This perturbation is particularly acute when electron distribution within cathode 10 is affected by the magnetic field of condenser lens C1 and electrons/charged particles are subject to a substantial magnetic field as they leave the surface 12 of the cathode where their axial velocity is substantially zero and acceleration by the electrostatic field of anode 14 (illustrated by equipotential field lines 16) begins. The interference with the condenser lens causes the electrons to acquire an angular momentum augmented by Coulomb effects, leading to an intolerable enlargement of the cross-over generated by the condenser lens as well as deleterious current density distribution, as shown in FIG. 1B. (It should be noted that the term "cross-over" does not literally apply to the described circumstances, since the acquired angular momentum prevents the electrons from crossing the system axis, but, rather, forces them to spiral around the axis.) This cross-over, being an image of a virtual cross-over, serves as the effective source for all of the optics downstream from the cross-over and must meet definite criteria to permit the necessary optical performance of the tool.

Another source of interference is the magnetic field of the heater element (filament) 18 (schematically shown in FIG. 1A as an indirect, coiled heater element) of the electron (charged particle) emitter or cathode with the near zero energy electrons emerging from the source. This magnetic field is usually unavoidable since it derives from the necessary and relatively large current flowing in the heater element. The filament structure will also have unavoidable asymmetries which result in similarly unavoidable asymmetries in the magnetic field. Thus asymmetric angular momentum is imparted to the electrons emerging from the electron (charged particle) emitter or cathode which results in an intolerable level of astigmatism at the cross-over. As pointed out above, the quality of the beam at the cross-over is critical to the performance of downstream optics in the tool.

An undesired but unavoidable electrostatic lens also exists in the electron (charged particle) emitter or cathode and is formed essentially by the opening 14' in the anode 14 through which the electrons pass to form the beam. This lens causes increased aberrations.

The collective effects of these unavoidable elements or element interferences is illustrated by the beam trajectories and trajectory distributions 20 shown in FIG. 1A in which the cross-over is enlarged and aberrated. As a consequence, non-uniformity of illumination is caused at the region between 52 and 54 of the shaping aperture plate 50. These irregularities in electron trajectories and illumination uniformity will be propagated through other elements of the electron-optical column and degrade performance of those elements.

As described, four individual problems must be addressed:

1.) Perturbation of the emerging electrons by the field of condenser lens C1,

2.) Perturbation of the emerging electrons by the field of the heater element,

3.) Spherical aberration of the electrostatic (anode) lens, and

4.) Astigmatism of the cross-over caused by asymmetries of the heater filament field as well as deviation of the beam from the coaxial path through the condenser system.

The first three of these problems cause enlargement and disturbance of the current density distribution in the cross-over, consequently causing disturbance of the illumination uniformity in the shaping aperture and, subsequently, in the reticle carrying the circuit pattern to be imaged onto the target or wafer. The fourth of these problems is a combined effect of deviations from theoretically ideal operation originating largely with the heater filament field and aggravated by non-ideal beam path through other elements of the system.

Conceivable solutions to the first of these problems include increasing the distance between the electron (charged particle) emitter or cathode and the first condenser and/or confinement of the condenser lens field by reducing the pole piece bore. However, increasing the separation of the source and the first condenser lens sufficiently to completely or even substantially eliminate the interference is not feasible due to the physical constraints on column length alluded to above which would, for example, cause the dimensions of the column and the tool to exceed the height of standard clean rooms in which the tool is preferably employed, require gross changes in optics necessary to obtain desired magnification and the like and increase effects of Coulomb interactions. It also would severely change the optics to the point that the axial positions between the cross-over and the emitter/cathode image at the shaping aperture would converge to the detriment of the entire system concept, which is optimized for electron beam lithography (EPL).

Confinement of the condenser lens field by reduction of pole piece bore is not feasible because of the corresponding increase in aberrations at the cross-over due to the required relatively large electron emitting surface of the electron (charged particle) emitter or cathode, if the pole piece bore is not significantly larger than the electron emitting surface. Neither of these measures would address the astigmatism caused by the filament field. Increasing the separation of the emitter/cathode and the first condenser without changing the anode position weakens the lens and its aberrations. However, shifting the anode in the same direction as the cathode/emitter would have a negative effect. However, the electrostatic lens is of relatively lesser significance in the context of the present invention.

Figure 2A:
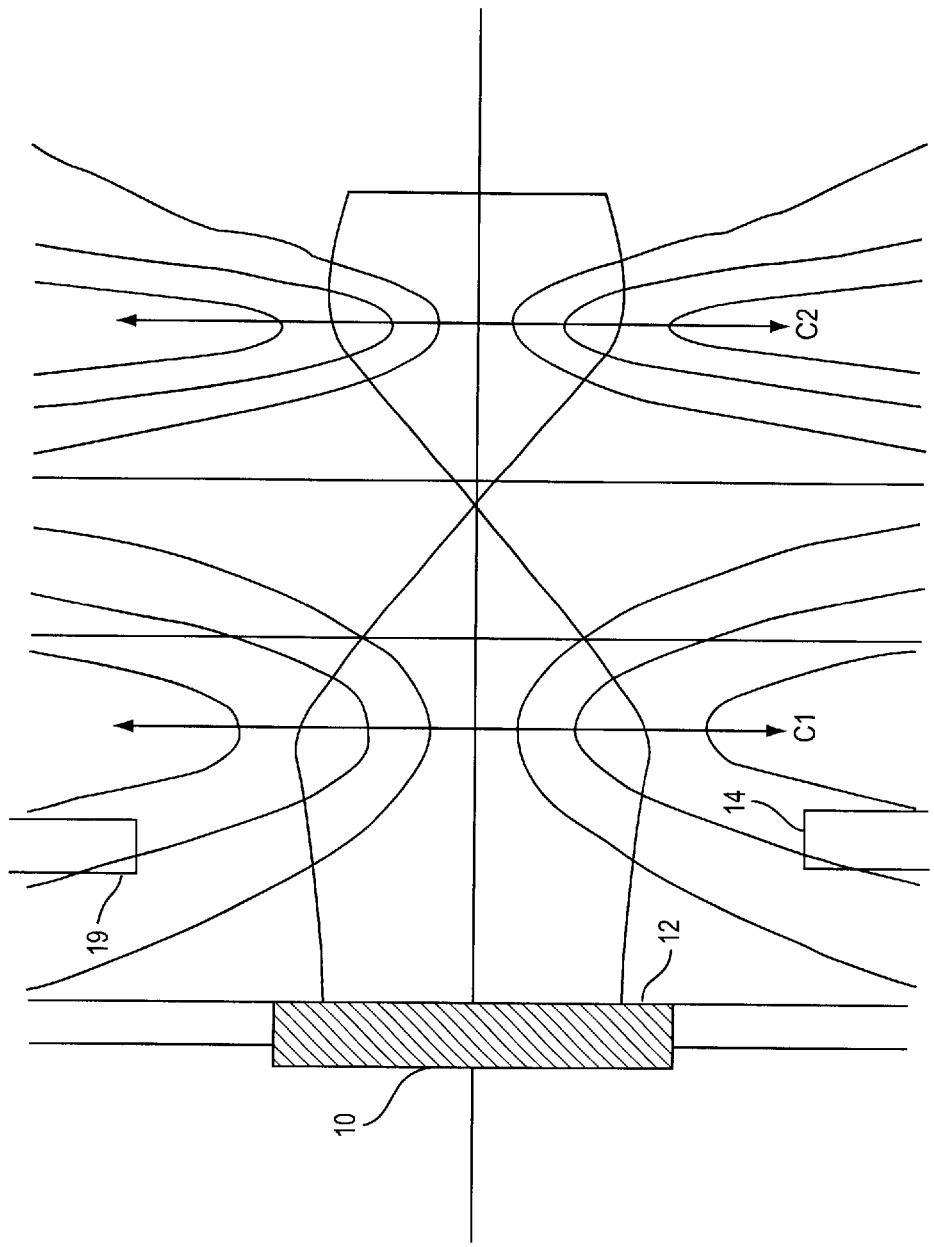
FIG. 2A is a view of a simulation of trajectory of portions of a beam in a portion of an electron beam projection lithography tool illustrating a first embodiment of the invention.
Figure 2B:
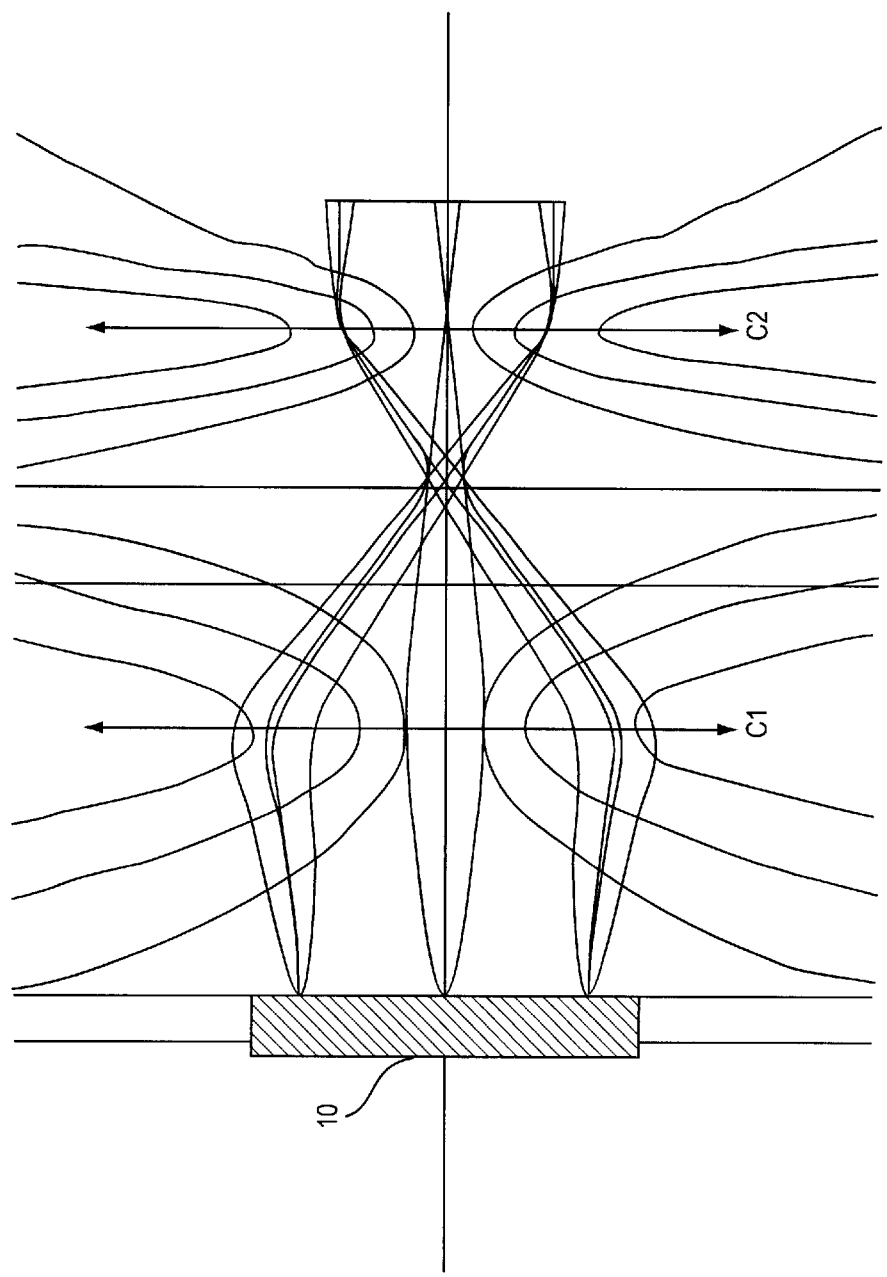
FIG. 2B illustrates, with additional trajectories shown, substantial correction of the aberrated crossover of FIG. 1A.

Referring now to FIG. 2A, a first embodiment of the invention will be discussed. The positions of the electron-optical elements as depicted in FIG. 2A are essentially the same as in FIG. 1A except that the surface 12 of cathode 10 is displaced from the anode 14 and condenser C1 by a moderate amount of, for example, 40 mm. It has been found that the result is already substantial, as shown in FIG. 2B, as electrons from the emitter points far off the axis closely approach the axis, thus reducing the cross-over in size to almost its theoretical minimum.

It should be understood that the excitations of both condenser lenses C1 and C2 must be readjusted to re-establish the proper imaging conditions required by the entire projection system. The trajectories illustrated in FIGS. 2A (and 3A) do not show the trajectories after such readjustment but are intended to illustrate the important effect of the invention on the cross-over which serves as the illumination source for the remainder of the system.

Figure 3A:
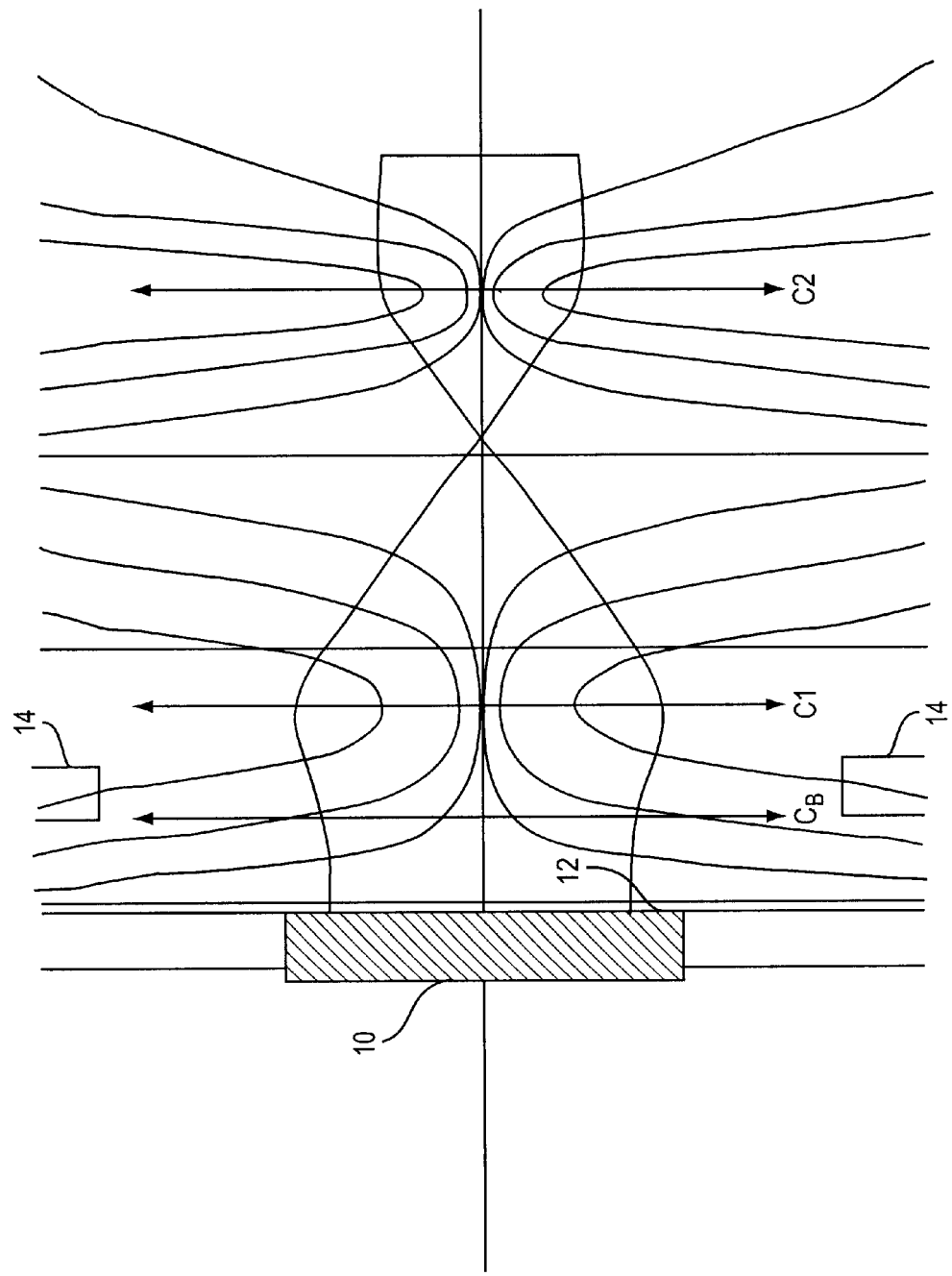
FIG. 3A is a view of a simulation of trajectory of portions of a beam in a portion of an electron beam projection lithography tool illustrating a second and preferred embodiment of the invention.

A second embodiment of the invention will now be explained in connection with FIG. 3A. FIG. 3A is the same as FIG. 1A except that an additional thin magnetic lens, referred to as a bucking lens, $C_B$ is interposed between first condenser lens C1 and the cathode (and preferably within or preceding the anode), and the improved electron trajectories achieved thereby are shown. This lens is preferably driven proportionally and with the opposite polarity to first condenser lens C1 such that the magnetic field at the surface 12 of cathode 10 is reduced to zero (e.g. fully counterbalancing the field of lens C1).

Figure 3B:
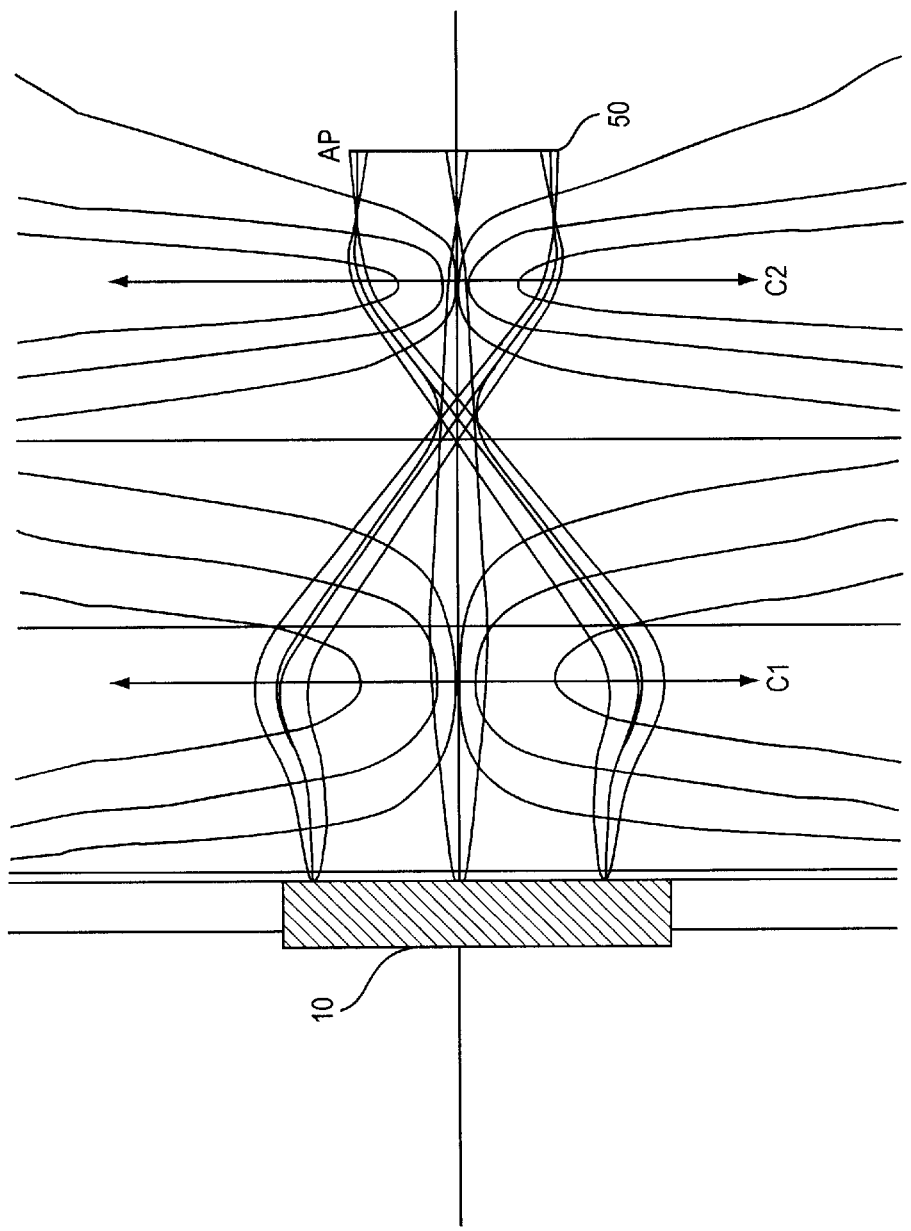
FIG. 3B illustrates, with additional trajectories shown, correction of the aberrated crossover of FIG. 1A in accordance with the second embodiment of the invention shown in FIG. 3A, FIGS. 4A and 4B show cross-sections through lens arrangements and associated magnetic field lines illustrating various configurations of a bucking lens included in the second and preferred embodiment.

Therefore, lens $C_B$ fully shields the cathode from the field of the first condenser lens C1 and effectively eliminates the magnetic field which can impart angular momentum to the electrons until they have been substantially accelerated by the electrostatic field between the cathode 12 and anode 14 and cannot be perturbed as readily as is possible at lower velocities and energies, as can be appreciated by a comparison of FIG. 3B with the "Related Art" of FIG. 1B. Now, all electron trajectories are actually crossing the system axis, producing a real cross-over of the desired size and current distribution. For reducing the effect of cathode irregularities, which reduce illumination uniformity at the shaping aperture, the shaping aperture AP is placed at an axial position slightly farther from the cathode image, as shown in FIG. 2B or 3B.

Figure 4A:
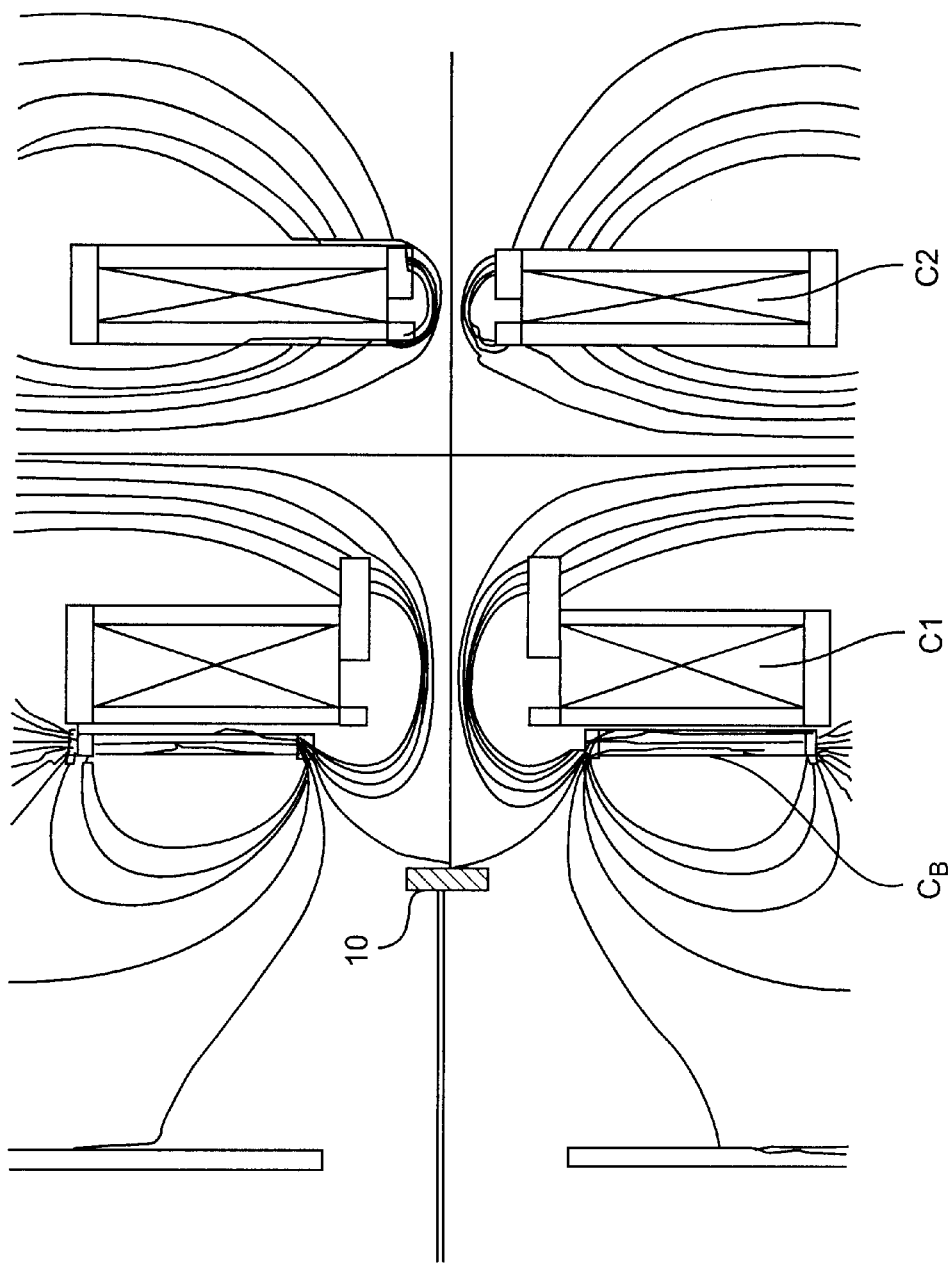
Figure 4B:
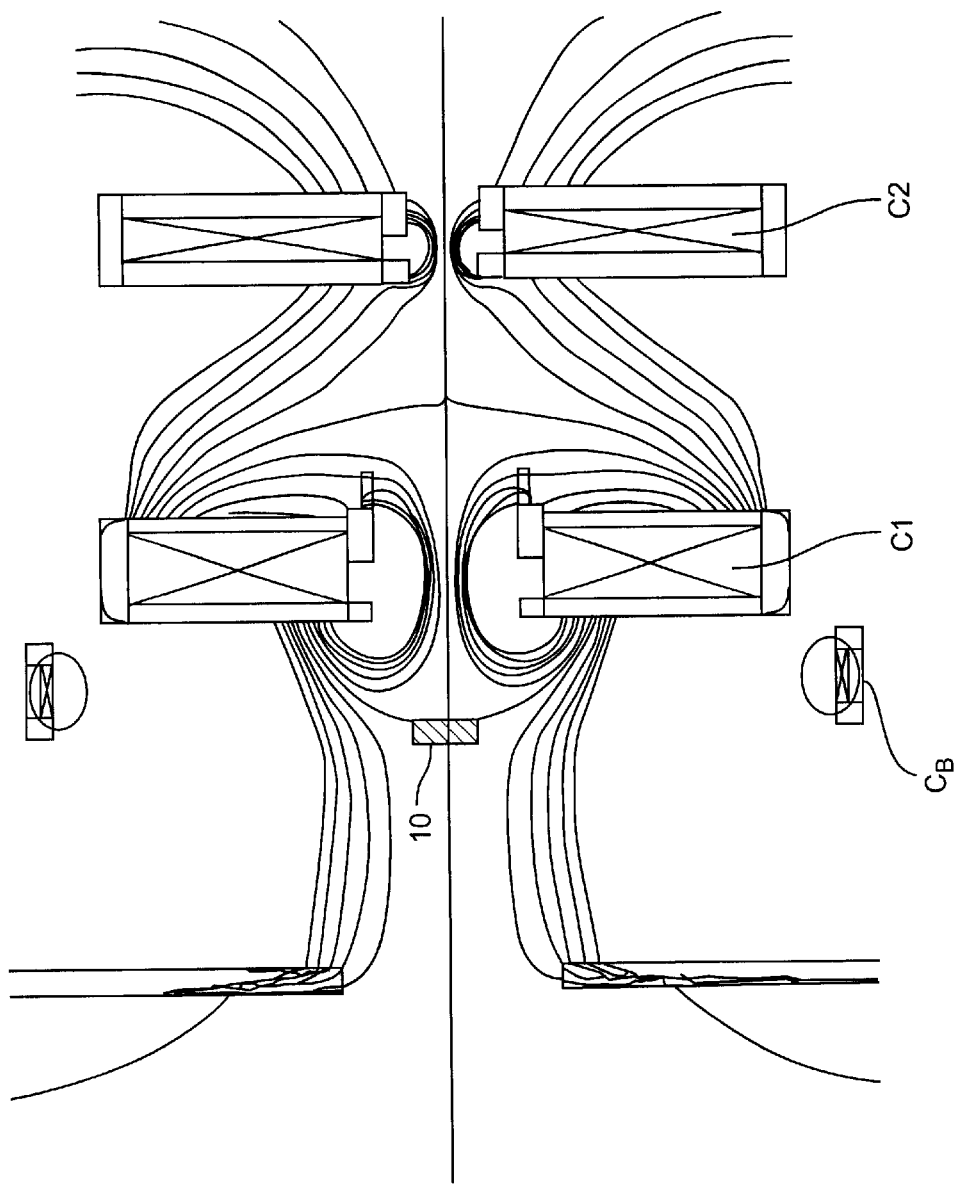

FIGS. 4A–4B show various possible implementations of the bucking lens $C_B$, configured in different ways from which other configurations will be apparent to those skilled in the art. These and other implementations, if suitably designed and operated, have substantially the same effect of cancelling at least the axially symmetric component of any magnetic field at the most critical location, the emitter surface from which the charged particles emerge with minimum or no kinetic energy. Differences between the configurations as shown and others may be of significance only with regard to their effectiveness in terms of electrical power required to achieve the desired field nulling. Further differences between these configurations may arise with regard to the shape of the combined field of the condenser and bucking lens along the system axis, the impact of which is small and not critical to overall system performance.

FIG. 5 depicts a comparison between the configuration of FIG. 4B and the "related art" of FIG. 1A which gives rise to the deleterious particle trajectories corrected or avoided by the invention. As alluded to above, the anode 14 of the first embodiment (FIG. 2A) is relocated closer to the cathode 10. This shift of the anode location, although indicated above to be detrimental, is accepted as having only a minor and tolerable effect on the anode electrostatic lens while providing correction for larger effects. The deleterious effects of anode shifting is also outweighed by the advantage of providing space to place a stigmator at an optimal location in the center of the first condenser C1. This stigmator, comprising two sets of quadrupoles, serves both to correct for the problem (4.), listed above; compensating for the asymmetric magnetic field generated by the heater current in the filament and any residual asymmetry caused by deviations of the lens fields and/or the beam path from axial symmetry both before and after the first condenser.

A fourth embodiment of the invention can be visualized from FIG. 5 in which the stigmator is inserted between two sets of alignment coils shown which, with proper wiring that will be evident to those skilled in the art, can be operated as two sets of quadrupoles simultaneously with their primary task of adjusting the axis of the beam. Such a "variable axis stigmator" is described in U.S. Pat. Nos. 5,389,858 and 5,481,164 which are hereby fully incorporated by reference herein. This fourth embodiment eliminates any requirement to shift the anode as well as the cathode if the bucking lens shown in FIG. 5 is replaced by a bucking lens similar to that of FIG. 4A.

Figure 6:
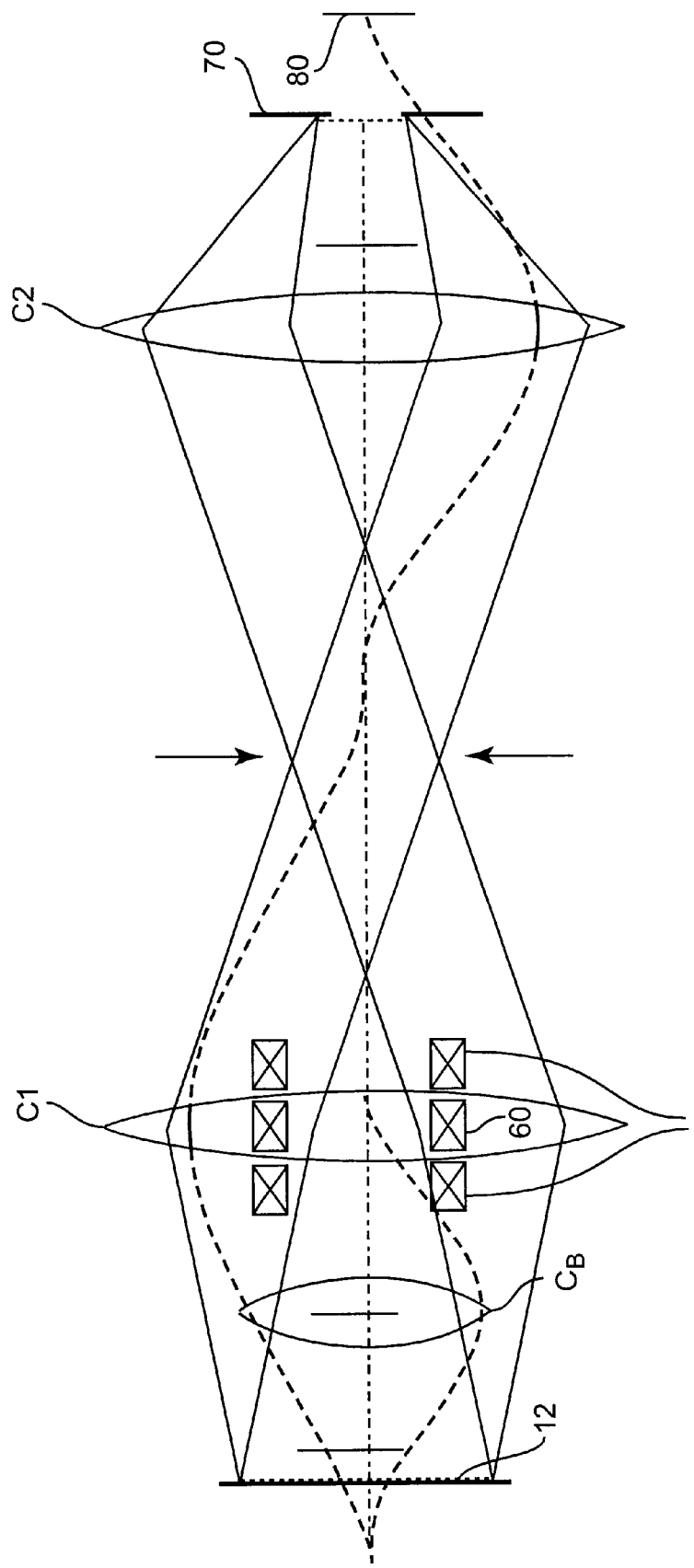

FIG. 6 schematically depicts the first order optics of the critical section of the electron beam projection system to which the invention is principally directed. Condenser lenses C1 and C2 image the emitter surface onto the plane of the shaping aperture which, in turn, is projected onto the reticle 70 and then imaged onto the target/wafer 80 by subsequent portions of the system. The axial field distributions of the condensers C1, C2 and the bucking lens $C_B$ illustrate nulling of the first condenser field or any other magnetic field at the emitter. The stigmator and alignment coils 60, 62 discussed above are also illustrated.

In view of the foregoing, it is seen that the invention provides substantially complete correction for the interfering effects of a first condenser lens and the cathode and for the unavoidable effects of the magnetic field of the cathode heating filament and the electrostatic lens of a charged particle beam tool (or any other sources of a magnetic field in the critical region near the charged particle emitting surface), which have not been previously recognized, but which have been found to produce intolerable aberrations in electron beam projection tools at extremely small minimum feature size regimes. The invention is effective to provide these corrections without requiring violation of practical constraints of column length or requiring other significant changes in the column optics. In its preferred form, the invention also provides simplified adjustment for optimum performance.

While the invention has been described in terms of a single preferred embodiment, those skilled in the art will recognize that the invention can be practiced with modification within the spirit and scope of the appended claims.

Having thus described the invention, what is claimed as new and desired to be secured by Letters Patent is as follows:

1. A charged particle beam illumination system including
   a first condenser lens,
   an accelerating electrode,
   a charged particle emitter axially separated from said accelerating electrode, and
   means for reducing the magnetic field at said charged particle emitter.

2. A system as recited in claim 1 wherein said accelerating electrode is an anode and said charged particle emitter is a cathode.

3. A system as recited in claim 1 wherein said first condenser lens generates a cross-over of particle trajectories originating from said charged particle emitter.

4. A system as recited in claim 1, wherein said means for reducing the magnetic field at said charged particle emitter is an increase of distance between said first condenser lens and said emitter sufficient to substantially reduce aberrations at a cross-over, caused by interference of said magnetic field of said first condenser lens with the charged particles emerging from said charged particle emitter at the location of said charged particle emitter.

5. A system as recited in claim 1, wherein said means for reducing the magnetic field at said charged particle emitter includes
   a magnetic lens.

6. A system as recited in claim 5 wherein said magnetic lens for reducing the magnetic field at said charged particle emitter is located between said first condenser lens and said charged particle emitter.

7. A system as recited in claim 1, further including
   a stigmator located between said accelerating electrode and said first condenser lens, said stigmator being driven to correct astigmatism at the crossover.

8. A system as recited in claim 7, wherein said stigmator is a variable axis stigmator.

9. A system as recited in claim 7, wherein said stigmator is also driven to counteract asymmetric magnetic fields in said charged particle beam source.

10. A system as recited in claim 7, wherein said means for reducing the magnetic field of said first condenser lens at said charged particle emitter further includes
    a magnetic lens.

11. A system as recited in claim 10, wherein said magnetic lens for the reducing magnetic field at said charged particle emitter is located between said first condenser lens and said charged particle emitter.

12. A charged particle beam illumination system including
    a first condenser lens,
    an accelerating electrode,
    a charged particle emitter axially separated from said accelerating electrode, and
    wherein said charged particle beam illumination system has a configuration or includes a magnetic element for reducing the magnetic field at said charged particle emitter.

13. A system as recited in claim 12 wherein said accelerating electrode is an anode and said charged particle emitter is a cathode.

14. A system as recited in claim 12 wherein said first condenser lens generates a cross-over of particle trajectories originating from said charged particle emitter.

15. A system as recited in claim 12, wherein said configuration for reducing the magnetic field at said charged particle emitter is an increase of distance between said first condenser lens and said emitter sufficient to substantially reduce aberrations at a cross-over, caused by interference of said magnetic field of said first condenser lens with the charged particles emerging from said charged particle emitter at the location of said charged particle emitter.

16. A system as recited in claim 12 wherein said magnetic element for reducing the magnetic field at said charged particle emitter is located between said first condenser lens and said charged particle emitter.

17. A system as recited in claim 1, further including
    a stigmator located between said accelerating electrode and said first condenser lens, said stigmator being driven to correct astigmatism at the crossover.

18. A system as recited in claim 17, wherein said stigmator is a variable axis stigmator.

19. A system as recited in claim 17, wherein said stigmator is also driven to counteract asymmetric magnetic fields in said charged particle beam source.

20. A system as recited in claim 19, wherein said magnetic lens for the reducing magnetic field at said charged particle emitter is located between said first condenser lens and said charged particle emitter.

* * * * *